United States Patent
Aslandere et al.

(10) Patent No.: US 11,544,430 B2
(45) Date of Patent: Jan. 3, 2023

(54) ADVANCED MODEL MAPPING AND SIMULATIONS

(71) Applicant: Ford Global Technologies, LLC, Dearborn, MI (US)

(72) Inventors: Turgay Isik Aslandere, Nordrhein-Westfalen (DE); Evangelos Bitsanis, Nordrhein Westfalen (DE); Michael Marbaix, Haillot (BE); Frederic Stefan, Aachen (DE); Alain Marie Roger Chevalier, Henri-Chapelle (BE)

(73) Assignee: Ford Global Technologies, LLC, Dearborn, MI (US)

( * ) Notice: Subject to any disclaimer, the term of this patent is extended or adjusted under 35 U.S.C. 154(b) by 223 days.

(21) Appl. No.: 16/862,329

(22) Filed: Apr. 29, 2020

(65) Prior Publication Data

US 2020/0349307 A1 Nov. 5, 2020

(30) Foreign Application Priority Data

Apr. 30, 2019 (DE) .......................... 102019206212.1

(51) Int. Cl.
*G06F 30/27* (2020.01)
*G06N 3/04* (2006.01)
*G06N 3/08* (2006.01)

(52) U.S. Cl.
CPC ............... *G06F 30/27* (2020.01); *G06N 3/04* (2013.01); *G06N 3/08* (2013.01)

(58) Field of Classification Search
CPC . G06F 30/27; G06N 3/04; G06N 3/08; G06N 3/0454; G06N 3/02
USPC .......................................................... 706/12
See application file for complete search history.

(56) References Cited

U.S. PATENT DOCUMENTS

| 9,607,113 | B1 | 3/2017 | Ciolfi et al. | |
|---|---|---|---|---|
| 2018/0144243 | A1* | 5/2018 | Hsieh | G06F 30/20 |
| 2019/0303759 | A1* | 10/2019 | Farabet | G06F 9/455 |

* cited by examiner

*Primary Examiner* — Paul Dinh
(74) *Attorney, Agent, or Firm* — Brandon Hicks; Kilpatrick Townsend & Stockton LLP

(57) ABSTRACT

The invention relates to a system for performing a method for performing computer-aided simulations. The system loads an input dataset which is based on user interactions of a user indicating a manipulation of a representation of a component, provides a tracking dataset indicating changes in the representation through the manipulations by evaluating the input dataset, provides an output dataset which is based on evaluation of the tracking dataset by means of machine learning, where the output dataset assigns a model to the representation, and outputs the output dataset.

15 Claims, 5 Drawing Sheets

ADVANCED MODEL MAPPING AND SIMULATIONS

CROSS-REFERENCES TO RELATED APPLICATIONS

This application claims priority under 35 U.S.C. § 119 to German Patent Application No. 102019206212.1, filed on Apr. 30, 2019, entitled METHOD FOR PERFORMING COMPUTER-AIDED SIMULATIONS, the contents of which is hereby incorporated by reference in its entirety for all purposes.

TECHNICAL FIELD

The invention relates to a method for performing computer-aided simulations.

BACKGROUND

Computer-aided simulations are used, for example, in the automobile industry. They are used not only for the development of new systems, but also for testing, verifying, and validating existing systems. The field of application in the automobile industry extends from engine development to autonomous driving.

Known systems for performing computer-aided simulations have simple user interfaces with graphical elements representing model components. Systems of this type are known, for example, from U.S. Pat. No. 9,607,113.

However, the degree of complexity of the systems (e.g., automotive systems including chassis, motors, transmissions, and the like) to be simulated is constantly increasing and the systems are becoming increasingly difficult to understand.

There is therefore a need to find ways to enable intuitive interaction and visual representation.

SUMMARY

The object of the invention is achieved by systems performing a method for performing computer-aided simulations, having the following steps: loading an input dataset which is based on user interactions of a user indicating a manipulation of a representation of a model, providing a tracking dataset indicating changes in the representation through the manipulations by evaluating the input dataset, providing an output dataset which is based on evaluation of the tracking dataset by means of machine learning, wherein the output dataset assigns a model to the representation, and outputting the output dataset.

The representation is a dataset for visual reproduction, such as e.g. an image of an internal combustion engine, a transmission, or a chassis. In other words, by e.g. tapping on a representation displayed on a touchscreen, said representation is selected and a learned model is assigned to it, such as e.g. a model for an internal combustion engine, a transmission or a chassis. An intuitive interaction and visual representation is thus achieved.

According to one embodiment, the machine learning comprises a use of a trained artificial neural network in order to perform a model classification. Machine learning is understood to mean a generation of knowledge from experience. The artificial neural network learns during a training phase from examples and can generalize said examples on completion of the training phase. This means that the artificial neural network does not simply memorize the examples, but rather the artificial neural network recognizes patterns and rules in the learning data. The artificial neural network can thus evaluate unknown data also.

According to a further embodiment, a deep network is used as a trained artificial neural network. A deep neural network is understood to mean an artificial neural network whose artificial neurons are arranged in layers in an input layer and an output layer and also in one or more intermediate layers.

According to a further embodiment, the trained artificial neural network is trained through supervised learning. Learning is therefore performed on the basis of input and output datasets. Correct functional values are provided for the respective input datasets during the training phase. The aim of supervised learning is to train the artificial neural network to be capable of establishing associations following a plurality of training sessions with different input and output datasets.

The invention also comprises a system for performing simulations of this type, an input device and a computer program product for an input device of this type, an output device and a computer program product for an output device of this type, a platform and a computer program product for a platform of this type, and also a tracking unit and a computer program product for a tracking unit of this type.

DETAILED DESCRIPTION

As described above, the degree of complexity of the systems (e.g., automotive systems including chassis, motors, transmissions, and the like) to be simulated is constantly increasing and the systems are becoming increasingly difficult to understand. To address this issue, described herein are systems and methods for enabling intuitive interaction and visual representations.

Computer-aided simulations are performed based on components selected by a user using a visual interface for selection. The selected components are classified, and a model is assigned to the component based on the classification. The user's further interaction with the components in the display then are used to simulate the behavior of the components given the modifications of the user's interactions.

Figure 1:
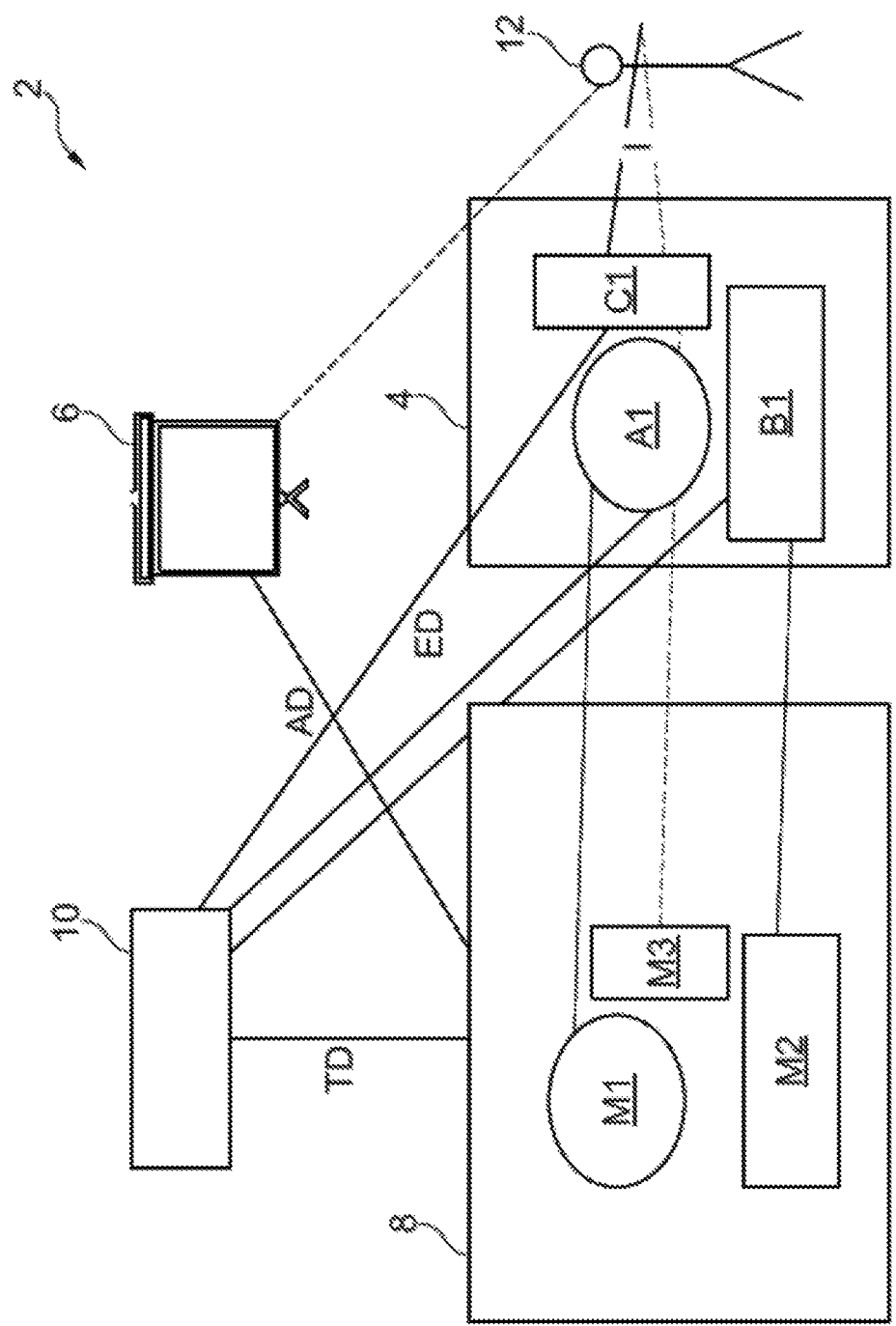
FIG. 1 illustrates a schematic view of a system for performing computer-aided simulations, according to some embodiments.

Turning to FIG. 1, a system 2 for performing computer-aided simulations is shown. As described below, the system 2 has hardware and/or software components for this purpose.

In the present example embodiment, a powertrain of a motor vehicle with the components internal combustion engine and transmission is intended to be simulated.

In the present example embodiment, the system 2 has an input device 4, an output device 6, a platform 8 and a tracking unit 10 for this purpose.

The input device 4, the output device 6, the platform 8 and the tracking unit 10 in each case have hardware and software components for the tasks and functions described below. Specifically, the input device 4, output device 6, platform 8, and/or tracking unit 10 may comprise one or more processors and one or memories. The memories may include instructions that, upon execution by the one or more processors, cause the one or more processors to perform the functionality described herein. The input device 4, output device 6, platform 8, and/or tracking unit 10 may be a computing device such as computing device 500 as described with respect to FIG. 5.

The input device 4 and the output device 6 can be combined into one device, i.e. a combined input/output device.

In the present example embodiment, the input device 4 and the output device 6 are two separate devices.

In the present example embodiment, the input device 4 is a touchscreen arrangement and screen surface that correspond to a desk. The input device 4 is thus designed to visually reproduce a respective dataset based on representations A1, B1, C1. In the present example embodiment, the representations A1, B1, C1 are assigned in each case to an image of an internal combustion engine, a transmission and a chassis.

In the present example embodiment, the output device 6 is a display screen. A virtual reality, for example, can be generated with the output device 6. The output device 6 may, for example, be a wall display (power wall) consisting of a plurality of individual displays, a space for projecting a three-dimensional illusory world of a virtual reality (e.g., CAVE—Cave Automatic Virtual Environment) or a head-mounted display (HMD) which is a visual output device to be worn on the head and which projects image data either on a display screen close to the eye or directly onto the retina of the HMD wearer.

The platform 8 is designed to perform the simulation e.g. using simulation software, such as e.g. Matlab-Simulink (Mathworks). In the present example embodiment, the platform performs simulations based on the model M1 for an internal combustion engine, on the model M2 for a transmission, and on the model M3 for a chassis.

As will be explained in detail later, the platform 8 further manages the assignment of the representations A1, B1, C1 to the respective models M1, M2, M3.

The tracking unit 10 is designed to detect and evaluate manipulations through user interactions I of a user 12 of one of the representations A1, B1, C1. For this purpose, in the present example embodiments, the tracking unit 10 loads an input dataset ED provided by the output device 4, the data of which, for example, represent a position and type of the respective representations A1, B1, C1 which are presented using the input device 4.

The tracking unit 10 is furthermore designed to provide a tracking dataset TD on the basis of an evaluation of the input dataset ID, said tracking dataset TD indicating changes in the representations A1, A2, A3, . . . An due to the manipulations.

The tracking unit 10 is furthermore designed to generate an output dataset AD on the basis of an evaluation of the tracking dataset TD, said output dataset AD being transmitted to the output device 6 for reproduction, wherein the data thereof also represent manipulations, e.g. the positions of the respective representation A1, B1, C1.

Figure 2:
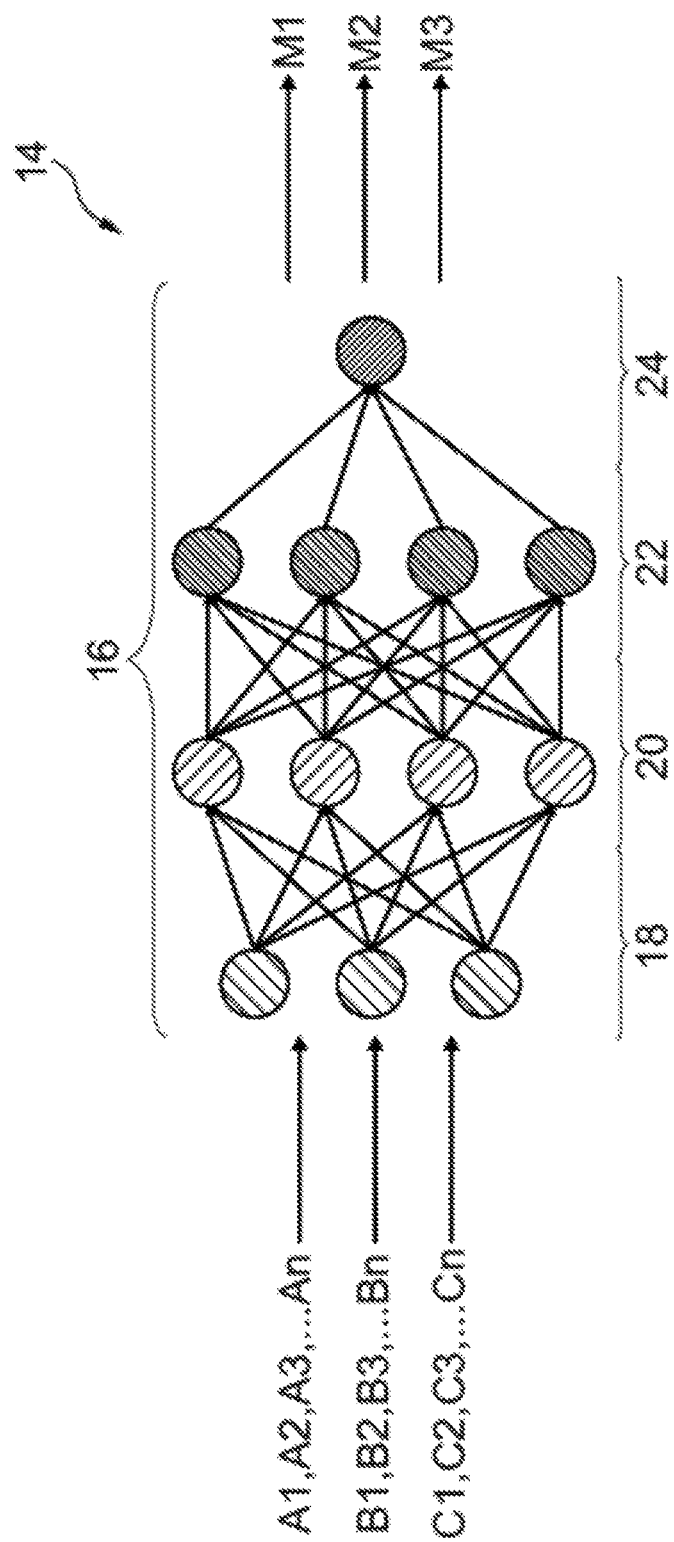
FIG. 2 illustrates a schematic view of a further component of the system shown in FIG. 1, according to some embodiments.

How the platform 8 assigns the representations A1, B1, C1 to the respective models M1, M2, M3 will now be explained with additional reference to FIG. 2.

To do this, a trained artificial neural network 14 is assigned to the platform 8 in order to perform a model classification. A model classification is understood to mean an assignment of objects, e.g., using the representations A1, A2, A3, . . . An and B1, B2, B3, . . . Bn and C1, C2, C3, . . . Cn as input, to the respective models M1, M2, M3.

The artificial neural network 14 may, for example, be a Convolutional Neural Network (CNN or ConvNet) or a Residual Neural Network (ResNet).

In the present example embodiment, the artificial neural network 14 is a deep neural network with a plurality of artificial neurons 16 which are disposed in a plurality of layers. One layer is an input layer 18, two further layers are intermediate layers 20, 22, and a further layer is an output layer 24. The example embodiment of FIG. 2 includes two intermediate layers 20 and 22, but any number of intermediate layers may be used.

An activation function which links the respective inputs to the outputs of the artificial neuron concerned is assigned to each artificial neuron of the plurality of artificial neurons 16. The activation functions have weighting factors whose values are optimized during a training phase, e.g. with deep-learning algorithms.

In the present example embodiment, the artificial neural network 14 has been trained through supervised learning, i.e. learning took place on the basis of predefined input and output datasets.

The trained artificial neural network 14 is thus designed to assign, as an example, the representations A1, A2, A3, . . . An to the model M1, the representations B1, B2, B3, . . . Bn to the model M2 and the representations C1, C2, C3, . . . Cn to the model M3.

Figure 3:
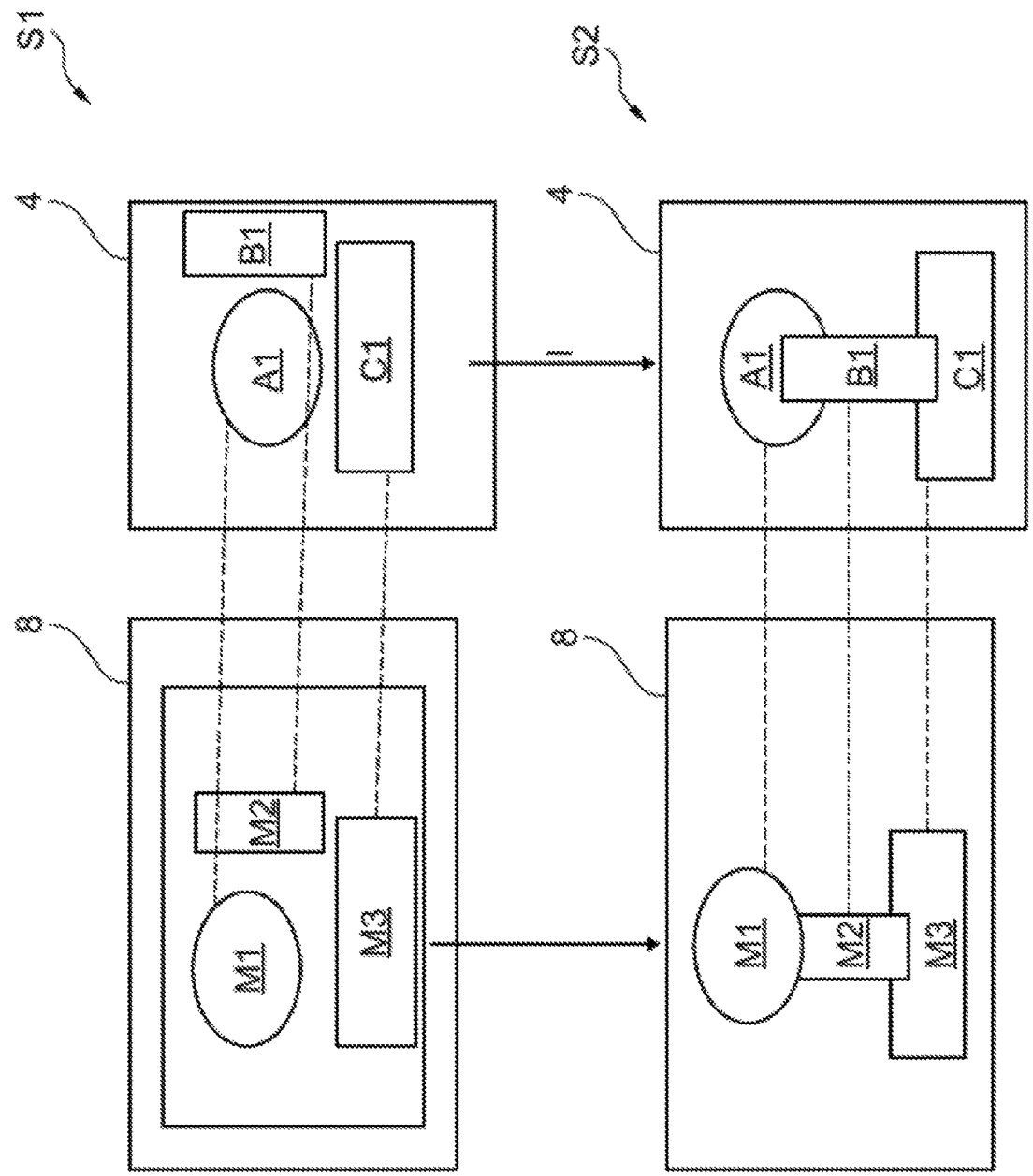
FIG. 3 illustrates a schematic view of components of the system shown in FIG. 1 during two states, according to some embodiments.

The operation of the system 2 will now be explained with additional reference to FIG. 3.

The input device 4 and the platform 8 are shown during a first state S1 before a user interaction I and during a second state S2 after the user interaction I.

It can be seen that the representations A1, B1, C1 have been repositioned through the user interaction I, in an arrangement corresponding to their interaction. Similarly, the models M1, M2, M3 assigned to the representations are reconfigured by the platform 8 through an automatic mapping corresponding to their interaction.

Figure 4:
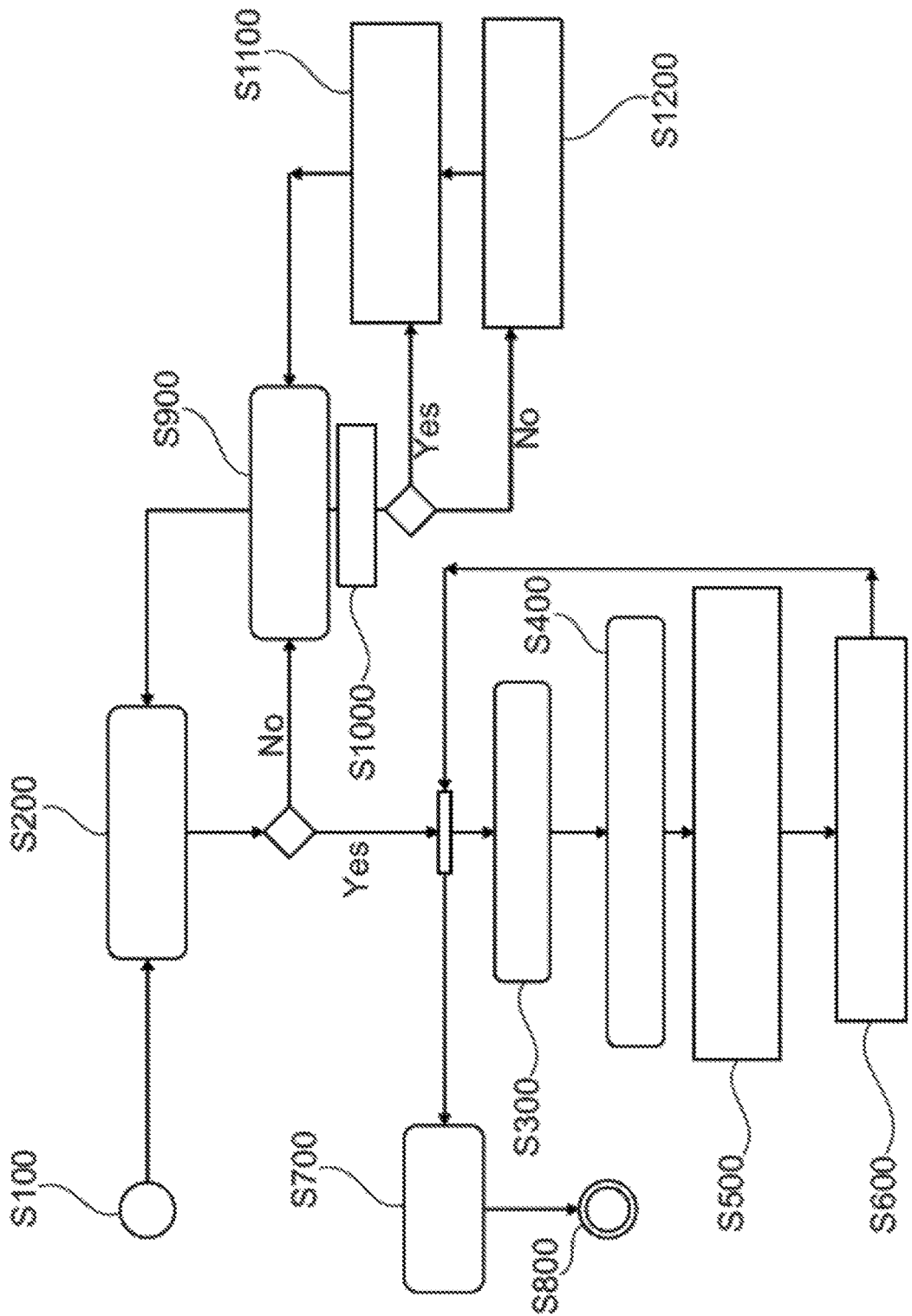
FIG. 4 illustrates a schematic view of a method sequence for operating the system shown in FIG. 1, according to some embodiments.

A detailed method sequence for operating the system 2 will now be explained with additional reference to FIG. 4.

In a first step S100, the user 12 starts the system 2.

In a further step S200, a check is carried out to determine whether an assignment of the representations of the objects (e.g., A1, A2, A3, . . . An and B1, B2, B3, . . . Bn and C1, C2, C3, . . . Cn) to the respective models (e.g., M1, M2, M3) has or has not already taken place.

If an assignment has taken place, the method is continued with a further step S300. In step S300, manipulations through user interactions I of the user 12 are tracked and the tracking dataset TD is created.

In a further step S400, the tracking dataset TD is then transmitted to the platform 8.

In a further step S500, the platform 8 determines which of the models (e.g., M1, M2, M3) belongs to one of the present representations (e.g., A1, A2, A3, . . . An; B1, B2, B3, . . . Bn; C1, C2, C3, . . . Cn) with the aid of the trained artificial network 14.

In a further step S600, the platform 8 provides the output dataset AD and accordingly updates the simulation, i.e. the position of the respective representations (e.g., A1, A2, A3, ... An; B1, B2, B3, ... Bn; C1, C2, C3, ... Cn) and the input and output variables linking the respective representations (e.g., A1, A2, A3, ... An; B1, B2, B3, ... Bn; C1, C2, C3, ... Cn) or model (e.g., M1, M2, M3).

If a predefined user interaction I was detected in a further step S700, the system 2 ends a further manipulation of one of the representations (e.g., A1, A2, A3, ... An; B1, B2, B3, ... Bn; C1, C2, C3, ... Cn) in a further step S800.

Conversely, if no assignment has taken place, the method is continued with a further step S900. In step S900, an assignment of the representations (e.g., A1, A2, A3, ... An; B1, B2, B3, ... Bn; C1, C2, C3, ... Cn) is automatically created.

In a further step S1000, a check is carried out to determine whether the assignments and the representations (e.g., A1, A2, A3, ... An; B1, B2, B3, ... Bn; C1, C2, C3, ... Cn) already exist.

If the assignments already exist, the method is continued with a further step S1100. In the further step S1100, training data (i.e. input datasets and corresponding output datasets) are generated in order to train the artificial neural network 14.

Conversely, if the assignments do not exist, the method is continued with a further step S1200. In the further step S1200, the assignments of the representations A1, A2, A3, ... An; B1, B2, B3, ... Bn; C1, C2, C3, ... C to the respective models M1, M2, M3 are formed.

A particularly intuitive interaction and visual representation are thus achieved.

Figure 5:
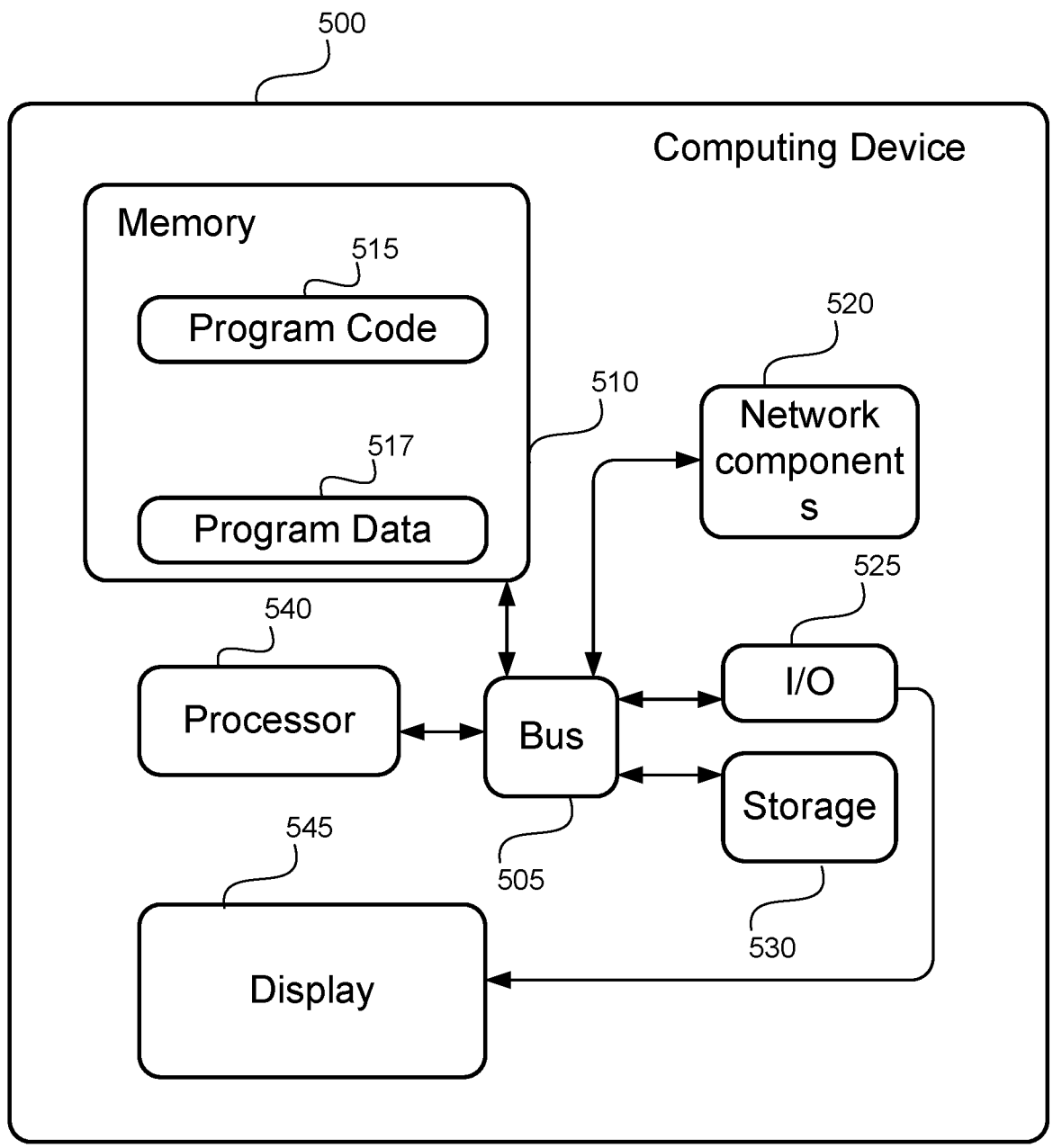
FIG. 5 illustrates a computer system, according to some embodiments.

FIG. 5 illustrates a block diagram of an example of a computer system 500. Computer system 500 can be any of the described computers or devices herein including, for example, input device 4, output device 6, tracking device 10, or platform 8. The computing device 500 can be or include, for example, an integrated computer, a laptop computer, desktop computer, tablet, server, or other electronic device.

The computing device 500 can include a processor 540 interfaced with other hardware via a bus 505. A memory 510, which can include any suitable tangible (and non-transitory) computer readable medium, such as RAM, ROM, EEPROM, or the like, can embody program components (e.g., program code 615) that configure operation of the computing device 500. Memory 510 can store the program code 515, program data 517, or both. In some examples, the computing device 500 can include input/output ("I/O") interface components 525 (e.g., for interfacing with a display 545, keyboard, mouse, and the like) and additional storage 530.

The computing device 500 executes program code 515 that configures the processor 640 to perform one or more of the operations described herein. Examples of the program code 615 include, in various embodiments input device 4, output device 6, platform 8, and tracking device 10, or any other data or suitable systems or subsystems that perform one or more operations described herein. The program code 515 may be resident in the memory 510 or any suitable computer-readable medium and may be executed by the processor 540 or any other suitable processor.

The computing device 500 may generate or receive program data 517 by virtue of executing the program code 515. For example, input dataset, output dataset, and tracking dataset are all examples of program data 517 that may be used by the computing device 500 during execution of the program code 515.

The computing device 500 can include network components 520. Network components 520 can represent one or more of any components that facilitate a network connection. In some examples, the network components 520 can facilitate a wireless connection and include wireless interfaces such as IEEE 802.11, Bluetooth, or radio interfaces for accessing cellular telephone networks (e.g., a transceiver/antenna for accessing CDMA, GSM, UMTS, or other mobile communications network). In other examples, the network components 520 can be wired and can include interfaces such as Ethernet, USB, or IEEE 1394.

Although FIG. 5 depicts a single computing device 500 with a single processor 540, the system can include any number of computing devices 500 and any number of processors 540. For example, multiple computing devices 500 or multiple processors 540 can be distributed over a wired or wireless network (e.g., a Wide Area Network, Local Area Network, or the Internet). The multiple computing devices 500 or multiple processors 540 can perform any of the steps of the present disclosure individually or in coordination with one another.

While the present subject matter has been described in detail with respect to specific aspects thereof, it will be appreciated that those skilled in the art, upon attaining an understanding of the foregoing, may readily produce alterations to, variations of, and equivalents to such aspects. Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. Accordingly, the present disclosure has been presented for purposes of example rather than limitation, and does not preclude the inclusion of such modifications, variations, and/or additions to the present subject matter as would be readily apparent to one of ordinary skill in the art Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

Aspects of the methods disclosed herein may be performed in the operation of such computing devices. The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device. The order of the blocks presented in the examples above can be varied—for example, blocks can be re-ordered, combined, and/or broken into sub-blocks. Certain blocks or processes can be performed in parallel.

What is claimed is:

1. A method for performing computer-aided simulations, the method comprising:
   assigning a plurality of representations to a plurality of models, wherein each representation is associated with a unique component and assigned to a unique model, wherein the plurality of models represent a simulation of a plurality of components;
   loading an input dataset associated with the plurality of representations;
   tracking changes to the input dataset based on user interactions of a user indicating a manipulation of at least one representation among the plurality of representations, wherein the changes define an interaction among the plurality of components;
   generating a tracking dataset indicating the changes in the at least one representation by the manipulation through evaluation of the input dataset;
   generating an output dataset, the output dataset based on evaluation of the tracking dataset using machine learning, wherein the output dataset reconfigures the plurality of models assigned to the plurality of representations based on the interaction among the plurality of components as defined by the user interactions; and
   outputting the output dataset.

2. The method of claim 1, wherein the machine learning comprises using a trained artificial neural network in order to perform a model classification.

3. The method of claim 2, wherein a deep neural network is used as the trained artificial neural network.

4. The method of claim 2, wherein the trained artificial neural network is trained through supervised learning.

5. A system for performing computer-aided simulations, the system comprising:
   a platform for assigning a plurality of representations to a plurality of models, wherein each representation is associated with a unique component and assigned to a unique model, wherein the plurality of models represent a simulation of a plurality of components;
   a tracking unit for loading an input dataset associated with the plurality of representations;
   an input device for receiving changes to the input data based on user interactions of a user indicating manipulation of at least one representation among the plurality of representations, wherein the changes define an interaction among the plurality of components;
   the tracking unit is further configured to generate a tracking dataset indicating the changes in the at least one representation based on evaluation of the input dataset;
   the platform is further configured to generate an output dataset based on evaluation of the tracking dataset, wherein generating the output dataset comprises using machine learning to reconfigure the plurality of models assigned to the plurality of representations based on the interaction among the plurality of components as defined by the user interactions; and
   an output device for outputting the output dataset.

6. The system of claim 5, wherein using machine learning to assign a model to the representation comprises using a trained artificial neural network to perform a model classification.

7. The system of claim 6, wherein the trained artificial neural network is a deep neural network.

8. The system of claim 6, wherein the trained artificial neural network is trained using supervised learning.

9. A computer-readable memory device having stored thereon instructions that, upon execution by one or more processors, cause the one or more processors to:
   assign a plurality of representations to a plurality of models, wherein each representation is associated with a unique component and assigned to a unique model, wherein the plurality of models represent a simulation of a plurality of components;
   load an input dataset associated with the plurality of representations;
   track changes to the input dataset based on user interactions of a user indicating a manipulation of at least one representation among the plurality of representations, wherein the changes define an interaction among the plurality of components;
   generate a tracking dataset indicating the changes in the at least one representation by the manipulation through evaluation of the input dataset;
   generate an output dataset, the output dataset based on evaluation of the tracking dataset using machine learning, wherein the output dataset reconfigures the plurality of models assigned to the plurality of representations based on the interaction among the plurality of components as defined by the user interactions; and
   output the output dataset.

10. The computer-readable memory device of claim 9, wherein using machine learning comprises using a trained artificial neural network in order to perform a model classification.

11. The computer-readable memory device of claim 10, wherein a deep neural network is used as the trained artificial neural network.

12. The computer-readable memory device of claim 10, wherein the trained artificial neural network is trained through supervised learning.

13. The method of claim 1, wherein the output dataset represents an updated simulation of the plurality of components.

14. The method of claim 13, wherein the updated simulation includes at least one of an updated position of the plurality of representations, an updated input variable or an updated output variable liking the plurality of representations.

15. The method of claim 1, wherein the plurality of components are vehicle components, and wherein the simulation represents a behavior of the vehicle components as configured by the user.

* * * * *